United States Patent [19]

Hidai et al.

[11] 4,267,456
[45] May 12, 1981

[54] ELECTRON BEAM TYPE EXPOSURE APPARATUS

[75] Inventors: Yutaka Hidai, Kodaira; Nobuo Okuda, Yokohama, both of Japan

[73] Assignee: Tokyo Shibaura Denki Kabushiki Kaisha, Kawasaki, Japan

[21] Appl. No.: 98,804

[22] Filed: Nov. 30, 1979

[30] Foreign Application Priority Data

Dec. 7, 1978 [JP] Japan .................. 53-150557

[51] Int. Cl.³ ........................................ H01J 37/00
[52] U.S. Cl. .............................. 250/492 A; 250/398
[58] Field of Search ............... 250/492 A, 492 R, 398, 250/396 R; 313/361; 219/121 EB, 121 EM

[56] References Cited

U.S. PATENT DOCUMENTS

| | | | |
|---|---|---|---|
| 3,900,737 | 8/1975 | Collier et al. | 250/492 A |
| 4,051,381 | 9/1977 | Trotel | 250/492 A |
| 4,119,857 | 10/1978 | Desperques-Volmier | 250/492 A |
| 4,151,421 | 4/1979 | Sumi | 250/492 A |
| 4,181,860 | 1/1980 | Sumi | 250/492 A |

*Primary Examiner*—Bruce C. Anderson
*Attorney, Agent, or Firm*—Oblon, Fisher, Spivak, McClelland & Maier

[57] ABSTRACT

An electron beam type exposure apparatus includes an electron generator for emitting electron beams modulated in accordance with dot data read out of a memory, a drive unit for vertically moving a table carrying a workpiece on which a pattern is to be drawn, and a scanning unit for scanning the surface of the workpiece by electron beams. The exposure apparatus further includes an image selection circuit for judging from dot pattern data read out of the memory whether a pattern to be drawn on the workpiece represents a regular or mirror image, and the dot data are read out of the memory in the order defined by the direction in which the workpiece-carrying table is moved and also by an output logic signal from the image selection circuit.

5 Claims, 7 Drawing Figures

ELECTRON BEAM TYPE EXPOSURE APPARATUS

BACKGROUND OF THE INVENTION

This invention relates to an exposure apparatus using electron beams. With the known raster scan type exposure apparatus using electron beams, limits are imposed on the width of each scanning in one direction. Therefore, a region in which a pattern is to be drawn (hereinafter referred to as "a pattern region") has to be divided into a plurality of frames. For example, as shown in FIG. 1 representing the prior art, the pattern region 10 is divided into a plurality of band-shaped sections or frames 10-1 to 10-N each having a width equal to the width Xs of electron beam scanning. Scanning is carried out for each frames. Namely, each time electron beam scanning is conducted for a width Xs in the direction X, a table carrying a mask is moved vertically in the direction Y for the width of a scanning line. When the scanning of a frame is brought to an end, the adjacent frame is scanned in the same manner. In this case, the customary practice of attempting to shorten a length of time required to draw a whole electron beam pattern is to scan the first frame 10-1 of FIG. 1, while the table is moved upward. The second frame 10-2 of FIG. 1 is scanned, while the table is moved downward. Thus the frames of the odd number order are scanned while the mask table is moved upward, whereas the frames of the even number order are scanned, while the table is moved downward. The above-mentioned conventional scanning process has to be carried out by changing the order in which serial data for electron beam scanning is to be supplied to an electron beam generator in accordance with the direction in which the table is moved.

Where a desired pattern is drawn, for example, by etching on a semiconductor wafer through a mask, the general practice is to set the mask directly on the semiconductor wafer for, exposure to light, or to dispose an optical system between the mask and semiconductor wafer and expose the semiconductor wafer to light through the mask and optical system. Where a desired pattern is to be drawn on the semiconductor wafer by directly mounting the mask on the semiconductor wafer, then it is demanded to form on the mask a pattern corresponding to the mirror image of a pattern which is to be finally produced on a semiconductor wafer (the term "mirror image" is herein defined to mean a pattern symmetrically disposed with respect to a desired pattern to be formed on the semiconductor wafer). Where a desired pattern is to be defined on a semiconductor wafer, by applying an optical system, it is advantageous to form on the mask a regular pattern, that is, a pattern directly conforming to the desired pattern which is to be finally produced on a semiconductor wafer.

Generally, it is necessary to change the order in which serial scanning data is to be supplied to an electron beam generator in accordance with the direction in which the mask-carrying table is moved, or according as a pattern to be drawn on a mask represents the above-defined regular (directly conforming) image or mirror image (symmetric image) with respect to a pattern finally produced on a semiconductor wafer.

SUMMARY OF THE INVENTION

It is according to object of this invention to provide an electron beam-type exposure apparatus, wherein the order in which serial scanning data is to be supplied to an electron beam generator can be changed in accordance with the direction in which the mask-carrying table is moved, or according as a pattern to be drawn on a mask represents the regular (directly conforming) image or mirror image (symmetric image).

According to an aspect of this invention, there is provided an electron beam type exposure apparatus comprising:

a table for carrying a workpiece; memory means for storing dot pattern data corresponding to a dot pattern to be drawn on the workpiece in the unit of words, each of said words being formed of a plurality of dot dots and an N number (N≧2) of words constituting dot pattern data corresponding to one scanning line; read control means for reading the dot pattern data out of the memory means in the unit of words; data conversion means for converting words read out of the memory means into serial dot data; electron beam generator means for emitting electron beams modulated in accordance with the serial dot data delivered from the data conversion means; first scanning means for scanning the workpiece in a first direction by electron beams issued from the electron beam generator means; second scanning means for moving the workpiece relatively to the electron beam generator in a direction perpendicular to the first direction; scanning signal generator means for supplying the second scanning means with a signal instructing the direction in which the workpiece is moved relatively to the electron beam generator means; image selection means for judging whether a pattern to be drawn on the workpiece represents a regular or mirror image and producing a signal corresponding to the selected one of the regular and mirror images; and control signal generator means which, upon receipt of output signal from the image selection means and scanning signal generator means, supplies the read control means with a control signal having a first or second logic level, thereby changing the order is which words are read out of the memory means.

DETAILED DESCRIPTION OF THE INVENTION

Figure 1:
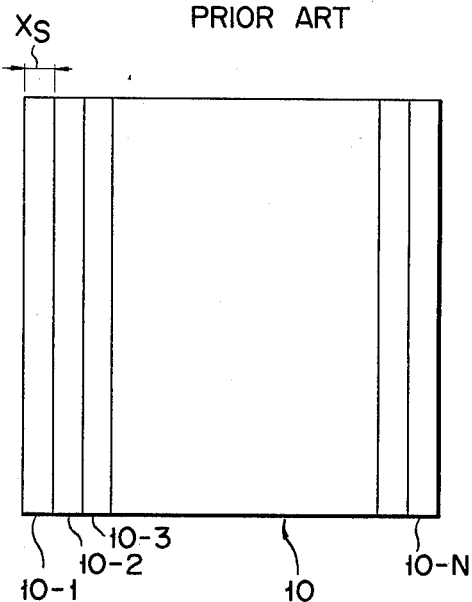
FIG. 1 shows the form of a pattern by way of illustrating the manner in which a pattern is drawn by the prior art raster scanning system in which a workpiece-carrying table is continuously driven.
Figure 2:
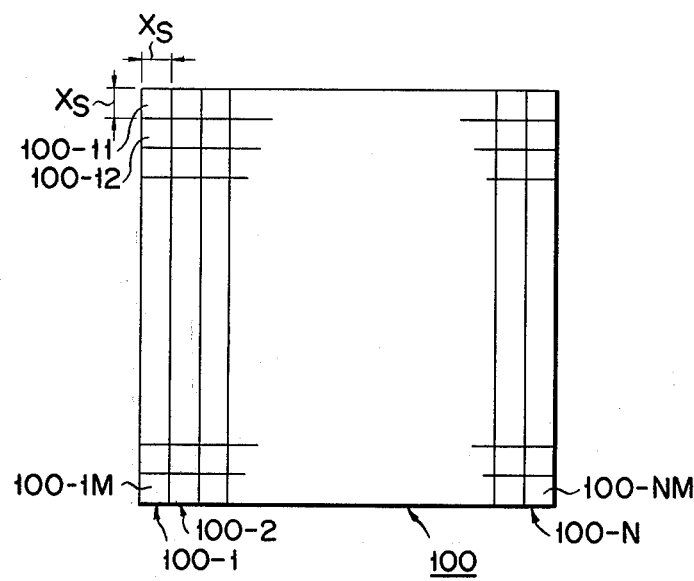
FIG. 2 indicates the form of a pattern region which is generally divided into a large number of pattern cells.

FIG. 2 shows a pattern region divided into an N number of frames 100-1 to 100-N. The frame 100-1 is divided into an M number of pattern cells 100-11 to 100-1M each having the same length and width Xs. The other frames 100-2 to 100-N are respectively divided into an M number of pattern cells each similarly having the same length and width Xs. In other words, the pattern region 100 is devided into an NM number of pattern cells 100-11 to 100-NM.

Figure 3:
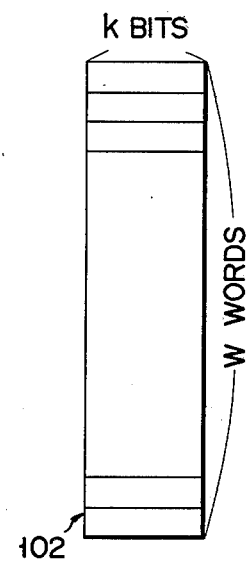
FIG. 3 sets forth a memory for storing pattern data corresponding to the pattern segments to be drawn in the numerous pattern cells.

There will now be described the case where a dot pattern having an nxn number of dots is drawn in each pattern cell. In this case, a dot pattern formed of an nxn number of dots is generally stored in a memory having a capacity of storing K bits×W words (where $K \times W = n^2$) as shown in FIG. 3.

Figures 4, 5, 6:
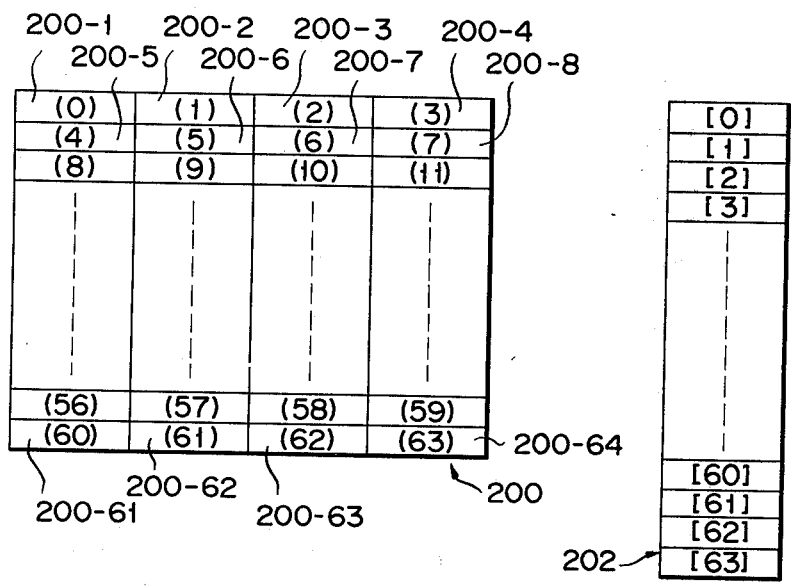
FIG. 4 shows a pattern cell divided into a large number of words.
FIG. 5 illustrates the manner in which the respective words constituting the pattern data of FIG. 4 is stored in a memory.
FIG. 6 indicates mirror-image type pattern cells corresponding to the pattern cells of FIG. 4.

Assuming $n=16$, $K=4$, and $W=64$, FIG. 4 shows the form of a pattern cell 200, and FIG. 5 indicates the address arrangement of a memory cell 202 for storing dot pattern data to be drawn in the respective pattern cells. As apparent from FIG. 4, one scanning line to be scanned by electron beams is formed of 16 bits. These 16 bits are separated into four dot groups having the same number of bits. In other words, one scanning line is constituted by four dot groups 200-1 to 200-4 each having four dots. Similarly, the second scanning line is formed of four dot groups 200-5 to 200-8 each having four dots. The last scanning line, that is, the 16th scanning line to formed of four dot groups 200-61 to 200-64 each similarly having four dots. The data of these dot groups 200-1 to 200-64 are stored in the corresponding addresses of the memory 202. In other words, the positions (0) to (63) of the dot groups 200-1 to 200-64 correspond to the word addresses [0] to [63] of the memory 202.

Where a regular pattern is formed by electron beam scanning, which is mask-carrying table (not shown) is moved upward, for example, the pattern cell 200 of FIG. 4 is lifted, then the words of the memory segments 202-1 to 202-64, that is, the dot data are read out in the order mentioned. Where a regular pattern is produced by electron beam scanning, while the pattern cell 200 is brought downward, then the direction in which electron beam scanning proceeds does not change. Therefore, it is necessary first to read the dot data of the dot groups 200-60 to 200-63 from the memory 202 in the order mentioned and then the dot data of the dot groups 200-56 to 200-59 corresponding to the succeeding scanning line in the order mentioned. In this case, the word a addresses [60], [61], [62], [63], . . . , [0], [1], [2], [3] of the memory 202 are specified in the order mentioned, and the dot data of the memory segments 202-0 to 202-63 are read out.

Assuming that the pattern region 100 of FIG. 2 represents a regular image, then a mirror image pattern is rendered symmetric with the regular image relative to a line parallel with a scanning line. FIG. 6 shows a pattern cell 204 included in the mirror image pattern which corresponds to the pattern cell 200 of FIG. 4. As scan from FIGS. 4 and 6, where a regular image pattern in formed by electron beam scanning, while the pattern cell 202 is moved forward, that is, upward, and also where a mirror image pattern is produced by electron scanning, while the pattern cell 204 is moved backward, that is, downward, then the dot data corresponding to the dot groups (0) to (63) are read out of the memory 202 in the order mentioned. Where a regular image pattern is generated by electron beam scanning, while the pattern cell 202 is moved backward or downward, and also where a mirror image pattern is produced by electron beam scanning, while the pattern cell 204 is moved forward, or upward, the word addresses [60], [61], [62], [63], . . . , [0], [1], [2], [3] of the memory 202 are specified in the order mentioned, and the corresponding data an successively read out of the memory 202.

Figure 7:
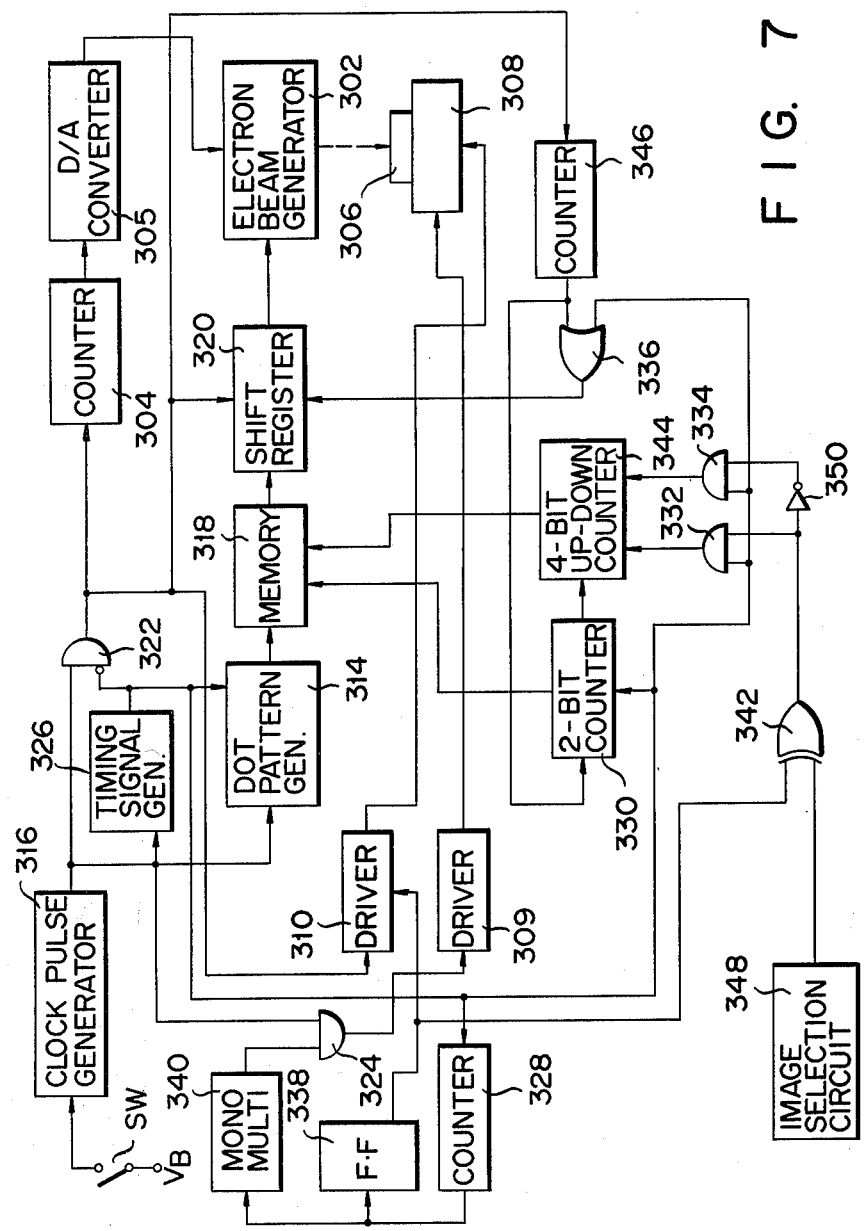
FIG. 7 is a circuit diagram of an electron beam type exposure apparatus embodying this invention.

FIG. 7 is a circuit diagram of an electrobeam type exposure apparatus embodying this invention. This, exposure apparatus includes an electron beam generator 302 which is driven by a scanning unit to produce electron beams. The scanning unit is formed of a 16-scale counter 304 and a digital-analog conversion device 305 for converting output digital signal from the 16-scale counter 304 into analog signals. The present exposure apparatus can scan a workpiece 306 mounted on a workpiece-carrying table 308 horizontally or in the direction X. The workpiece-carrying table 308 is driven by a driver unit 310 vertically or in the direction Y. The scanning unit and drive unit 310 are actuated by output clock pulses from a clock pulse generator 316. While an electron beam issued from the electron beam generator 302 scans the surface of workpiece 306 once, the workpiece-carrying table 308 is horizontally shifted for a prescribed distance, that is, by the width of the scanning line.

A dot pattern generator 314 produces dot pattern data representing a desired pattern in response to an output pulse from a clock pulse generator 316, causing word data shown, for example, in FIG. 5 to be stored in a memory 318. The contents of the memory 318 are successively supplied to a shift register 320 in word by word manner. Serial dot data converted from the word data are supplied to the electron beam generator 302. This electron beam generator 302 emits electron beams modulated in accordance with the contents of the memory 318 onto the workpiece 306 in the direction specified by an output signal from the D/A converter 305.

Output pulses from the clock pulse generator 316 are also conducted to AND gates 322, 324, dot pattern generator 314 and timing signal generator 326. This timing signal generator 326 sends forth an output signal which has a cycle period T ($=T1+T2$), that is, shows a high level during a period T1 and a low level during a period T2. An output signal from the timing signal generator 326 is supplied in the inverted form to the other input terminal of the AND gate 322. The output terminal of the AND gate 322 is connected to the counter 304 and also to the driver 310. The output terminal of the timing signal generator 326 is further connected to the control terminal of the dot pattern generator 314, M-scale counter 328, the reset terminal of a 2-bit counter or 4-scale counter 330, AND gates 332, 334 and OR gate 336. The output terminal of the counter 328 is connected to a flip-flop circuit 338 and monostable multivibrator 340. The output terminal of the flip-flop circuit 338 is connected to the direction control terminal of the driver unit 310, and also to an exclusive OR gate 342. The output terminal of the multivibrator 340 is connected to the driver unit 309 through the AND gate 324. The output terminals of the AND gates 332, 334 are connected to the initial value set terminals of a 4-bit up-down counter or 16-scale up-down counter 344 which constitutes, together with a 2-bit counter 330, a circuit for specifying the addresses of the memory 318. Another input terminal of the OR gate 336 is connected to the output terminal of a 4-scale counter 346 for counting output pulses fed through the AND gate 322. The output terminal of the OR gate 336 is connected to the data set terminal of the shift register 320. The output terminal of the 3-scale counter 346 is further connected to the input terminal of the 2-bit counter 330.

The electron beam type exposure apparatus of this invention further comprises an image selection circuit 348 for selecting a regular or mirror image pattern, for example, by manual operation. The output terminal of this image selection circuit 348 is connected to the other input terminal of the AND gate 332 through the exclusive OR gate 342, and also to the other input terminal of the AND gate 334 through the exclusive OR gate 342 and inverter 350.

There will now be described the operation of the electron beam type exposure apparatus of FIG. 7 embodying this invention. Where a switch SW connected to a power supply terminal $V_B$ is first closed, then the clock pulse generator 316 produces pulses, and the timing signal generator 326 sends forth a high level signal during a period T1. Upon receipt of an output pulse from the clock pulse generator 316, the dot pattern generator 314 causes dot pattern data corresponding to one memory cell to be successively written in the memory 318 in the unit of words. An output high level signal from the timing signal pattern 326 resets the contents of the 2-bit counter 330 to "00". In this case, the image selection circuit 348 sends forth a signal having a logic level of "1" or "0" according as a pattern to be finally drawn on the workpiece 306 represents a regular or mirror image. The flip-flop circuit 338 is preset by an external circuit (not shown) according as the workpiece-carrying table 308 is driven forward or backward. A signal having a logic level of "1" or "0" is sent forth accordingly from the output terminal of the flip-flop circuit 338. As a result, the exclusive OR gate 342 issues signals corresponding to the logic level of output signals from the flip-flop circuit 338 and image selection circuit 348. For example, when the workpiece-carrying table 308 is driven forward and an output signal from the image selection circuit 348 represents a regular pattern, or where the workpiece-carrying table 308 is driven backward, and an output signal from the image selection circuit 348 denotes a mirror image, then a signal having a logic level of "0" is sent forth from the exclusive OR gate 342. An output logic signal of "0" from the exclusive OR gate 336 is conducted to the initial value set terminal of the 4-bit up-down counter 344 through the inverter 350 and AND gate 334 to set the contents of the counter 344 to "0000". As a result, the counter 344 is set to an up-counting mode. Where the exclusive OR gate 342 issues a signal having a logic level of "1", then the 4-bit up-down counter 344 is so set as to have the contents of "1111". At this time, the counter 344 caries out down counting. As described above, the initial condition of the subject electron beam type exposure apparatus is preset before scanning is commenced.

Where the counter 344 has the contents of "0000" during the initial condition of the subject exposure apparatus, then the address [0] of the memory 318 is designated. The corresponding word data of four dots is transferred to the shift register 320, when the period T1 of an output signal from the time signal generator 326 is brought to an end and the generator 326 issues a low level signal. The contents of the shift register 320 are read out serially to the electron beam generator 302 in response to an output signal from the clock pulse generator 316 through the AND gate 322 when an output signal from the timing signal generator 326 has a low logic level. Where four clock pulses are issued from the clock pulse generator 316 through the AND gate 322, then the counter 346 produces an output pulse to increase the contents of the 2-bit counter 330 by one count, and supplies a data-receiving instruction to the shift register 320. As a result, the word address [1] of the memory 316 is specified, and the corresponding dot data is delivered to the shift register 320. The contents of the shift register 320 are read out to the electron beam generator 302, as described above, in response to an output clock pulse from the clock pulse generator 316. The electron beam generator 302 emits onto the workpiece 306 electron beam modulated in accordance with the contents of the shift register 320 of an angle defined by an output signal from the D/A converter 305.

Where the clock pulse generator 316 sends forth sixteen clock pulses through the AND gate 322, then the contents of the 2-bit counter 330 are changed into "00", and consequently the contents of the 4-bit up-down counter 344 are set to "0001", thereby specifying the word address [4] of memory 318. Thereafter, the addresses of the memory 316 are successively specified in the same manner as described above, until the last word address [63] is designated. The word data corresponding to the specified addresses of the memory 318 are transferred to the shift register 320. The electron beam generator 302 emits electron beams in accordance with teh dot data read out of the shift register 320. When the emission of electron beams is brought to an end, a pattern segment corresponding to one pattern cell of the workpiece 306 is fully drawn. A pattern segment corresponding to a pattern cell disposed adjacent to the first mentioned pattern cell in the direction Y begins to be drawn.

Where, during the initial stage, a signal having a logic level of "1" is sent forth from the exclusive OR gate 342 and the contents of the counter 344 are set to "1111", then the word address [60] off the memory 318 is first specified. The corresponding word data of four bits is transmitted to the shift register 320. The electron beam generator 302 emits electron beams in accordance with the contents of the shif register 320. Where the clock pulse generator 316 produces four clock pulses, then the counter 346 sends forth an output pulse, therby increasing the contents of the 2-bit counter 330 by one count. As a result, the word address [61] of the memory 318 is specified, and the corresponding word data is conducted to the shift register 320. Where the clock pulse generator 316 produces sixteen clock pulses. Then the contents of the 2-bit counter 330 are set to "00", and the contents of the 4-bit counter 340 indicate "1110". As a result, the word address [56] of the memory 316 is specified. Thereafter, the word addresses [57], [58], [59], [52], [53], . . . [0], [1], [2], [3] are specified in the order mentioned. The corresponding word data are read out of the memory 318 to the shift register 320. At this time, the electron beam generator 302 emits onto the workpiece 306 electron beams modulated in accordance with the contents of the shift register 320 in the direction corresponding to an output scanning signal from the D-A converter 305.

The timing signal generator 326 generates one output pulse, each time a dot pattern segment data corresponding to each pattern cell is read out. Where the counter 328 for counting output pulses from the timing signal generator 326 has counted an M number of pulses, namely, where electron beams corresponding to dot pattern segments constituting one form are irradiated onto the workpiece 306. Then, the flip-flop circuit whose output state has been changed produces from its output terminal a signal instructing drive direction opposite to that in which the workpiece-carrying table has previously been driven. When the instruction is supplied to the driven unit 310, then the monostable multivibrator 340 is energized to enable the AND gate 324 during a prescribed period. As a result, the driver unit 309 is actuated by an output clock pulse from the clock-pulse generator 316, thereby moving the workpiece-carrying table 308 in the horizontal direction X for a prescribed distance. At this time, output dot pattern data from the dot pattern generator 314 are stored in the memory 318. The contents of the 4-bit up-down counter 344 are set to a different initial value in accordance with an output signal from the exclusive OR gate 342 whose logic level has been changed. Thereafter, the workpiece-carrying table 308 is moved in a direction opposite to that in which the table 308 has previously been driven. Electron beams are emitted onto the workpiece 306, as already described, in accordance with the contents of the memory 318 and an output signal from the D/A converter 305.

This invention has been described by reference to the foregoing embodiment. However, the invention is not limited to this embodiment. Namely, it is possible to change the scale numbers of the counters 330, 344 in order to vary the number of bits constituting one word and the numbers of the columns and lines of each pattern cell.

With the foregoing embodiment, output signals from the counters 330, 344 were used to specify the addresses of the memory 318. If, necessary, however, it is possible to provide an address memory which is addressed by output signals from the counters 330, 344 to issue signals for specifying the addresses of the memory 318.

Further with the above-mentioned embodiment, a dot pattern data was read out of the dot pattern generator 314 to the memory 318 for each pattern cell in an amount corresponding to the pattern cell. However, as set forth in the patent specification (Ser. No. 53215) in which a plurality of memories were used, it is possible to provide a plurality of memories and store dot pattern data corresponding to a plurality of pattern cells successively in the respective memories, thereby making it possible to read dot pattern data continuously from these plural memories and consequently eliminating the necessity of stopping the movement of the workpiece-carrying table.

With the foregoing embodiment, the workpiece-carrying table 308 itself was moved. However, it is possible to fix the table 308 and shift the electron beam generator 302.

What we claim is:

1. An electron beam type exposure apparatus comprising:
    a table for carrying a workpiece;
    memory means for storing dot pattern data corresponding to a dot pattern to be drawn on the workpiece in the unit of words, each of said words being formed of a plurality of dot data and an N number N≧2) of words constituting dot pattern data corresponding to one scanning line;
    read control means for reading the dot pattern data out of the memory means in the unit of words;
    data conversion means for converting words read out of the memory means into serial dot data;
    electron beam generator means for emitting electron beams modulated in accordance with the serial dot data delivered from the data conversion means;
    first scanning means for scanning the workpiece in a first direction by electron beams issued from the electron beam generator;
    second scanning means for moving the workpiece relatively to the electron beam generator in a direction perpendicular to the first direction;
    scanning signal generator means for supplying the second scanning means with a signal instructing the direction in which the workpiece is moved relatively to the electron beam generator means;
    image selection means for judging whether a pattern to be drawn on the workpiece represents a regular or mirror image and producing a signal corresponding to the selected one of the regular and mirror images; and
    control signal generator means which, upon receipt of output signals from the image selection means and scanning signal generator means, supplies the read control means with a control signal having a first or second logic level, thereby changing the order in which words are read out of the memory means.

2. The electron beam type exposure apparatus according to claim 1, wherein the control signal generator means is formed of an exclusive OR gate circuit.

3. The electron beam type exposure apparatus according to claim 2, wherein the read control circuit comprises;
    a clock pulse generator;
    an N-scale counter for counting output clock pulses from the clock pulse generator;
    an up-down counter which, upon receipt of output pulses from the N-scale counter, produces count data which constitutes a signal for specifying the addresses of the memory means in combination with the count data of the N-scale counter;
    a set signal generator circuit;
    an initial value set circuit which, upon receipt of an output signal of first logic level from the set signal generator circuit and an output control signal from the exclusive OR gate circuit, sets the contents of the up-down counter at a minimum value, set said up-down counter for the up-counting mode, and, upon receipt of an output signal from the set signal generator circuit and an output control signal of the second logic level from the exclusive OR gate circuit, sets the contents of the up-down counter to a maximum value, and finally sets the up-down counter for the down-counting mode.

4. The electron beam type exposure apparatus according to claim 3, wherein, upon receipt of an output pulse from the clock pulse generator, the data conversion means converts words read out of the memory means into serial dot data; and the read control means divides the frequency of an output pulse from the clock pulse generator, and supplies a frequency-divided pulse to the N-scale counter.

5. The electron beam type exposure apparatus according to claim 3, wherein the initial value set circuit comprises:
    a first AND gate circuit supplied with output signal from the set signal generator circuit and exclusive OR gate circuit;
    an inverter circuit supplied with an output signal from the exclusive OR gate circuit; and
    a second AND gate circuit supplied with output signals from the inverter circuit and set signal generator circuit.

* * * * *